United States Patent [19]

Boudreau et al.

[11] Patent Number: 4,746,548
[45] Date of Patent: May 24, 1988

[54] METHOD FOR REGISTRATION OF SHADOW MASKED THIN-FILM PATTERNS

[75] Inventors: Robert A. Boudreau, Hampton, N.H.; Robert J. Wilkie, South Berwick, Me.

[73] Assignee: GTE Products Corporation, Danvers, Mass.

[21] Appl. No.: 790,695

[22] Filed: Oct. 23, 1985

[51] Int. Cl.⁴ .............................................. C23C 16/04
[52] U.S. Cl. .................. 427/248.1; 118/504; 118/505; 118/720; 118/721; 204/192.1; 427/255; 427/272; 427/282; 427/294
[58] Field of Search ............... 427/248.1, 255, 282, 427/294, 272; 204/192.1; 118/720, 728, 504, 505, 721

[56] References Cited

U.S. PATENT DOCUMENTS

| | | | |
|---|---|---|---|
| 3,510,349 | 5/1970 | Jones | 427/282 |
| 4,013,502 | 3/1977 | Staples | 427/248.1 |
| 4,273,812 | 6/1981 | Tsutsui et al. | 427/248.1 |
| 4,278,710 | 7/1981 | Jelks | 427/282 |
| 4,303,489 | 12/1981 | Morrison | 427/282 |
| 4,305,801 | 12/1981 | Patten et al. | 427/248.1 |
| 4,335,161 | 6/1982 | Luo | 427/282 |
| 4,344,988 | 8/1982 | Sono et al. | 427/282 |
| 4,492,180 | 1/1985 | Martin | 118/720 |
| 4,511,599 | 4/1985 | Rustomji | 427/282 |
| 4,615,781 | 10/1986 | Boudreau | 427/248.1 |

OTHER PUBLICATIONS

Tannas et al, "ACTFEL Displays".

Primary Examiner—Sadie L. Childs
Attorney, Agent, or Firm—Martha Ann Finnegan; Josè W. Jimenez

[57] ABSTRACT

A method of aligning thin-film structure patterns on a substrate formed with the use of an apertured mask in a vacuum deposition system. The present method includes the steps of positioning a mask holder assembly within a deposition chamber, the mask holder assembly having the apertured mask as part thereof and having means for engaging a substrate carrier; positioning a substrate carrier within the deposition chamber spaced from the mask holder assembly, the carrier having the substrate supported therein and having means for aligning the apertured mask with the substrate; engaging the mask holder assembly with the substrate carrier such that they are in operative contact; positioning a magnet in the deposition chamber adjacent the side of the substrate carrier opposite the mask holder assembly such that the apertured mask is held in operative contact with the substrate; vacuum-depositing a thin-film structure material through the apertured mask; and removing the magnet from the substrate carrier and disengaging the mask holder assembly from the substrate carrier, thereby resulting in the formation of the thin-film structures on the substrate.

6 Claims, 2 Drawing Sheets

METHOD FOR REGISTRATION OF SHADOW MASKED THIN-FILM PATTERNS

CROSS-REFERENCE TO CO-PENDING APPLICATIONS

In co-pending application Ser. No. 790,590 now U.S. Pat. No. 4,715,940 ("Mask for Patterning Electrode Structures in Thin-Film EL Devices" —Robert Boudreau), there is defined a mask structure and a method of fabricating electrode structures for a thin-film EL device that utilizes such a mask structure.

In co-pending application Ser. No. 790,589, now U.S. Pat. No. 4,615,781 ("Mask Assembly Having Mask Stress Relieving Feature" —Robert Boudreau), there is defined a mask assembly that provides support for a shadow mask while eliminating mask wrinkling during patterning of thin-film structures.

Both of the above applications are filed concurrently herewith and are assigned to the same assignee as the instant invention.

TECHNICAL FIELD

The present invention relates in general to the deposition of depositing thin-film structures, and particularly to an apparatus and a method for thin-film structure patterns on a substrate for a thin-film display device.

BACKGROUND OF THE INVENTION

Thin-film display panels (such as LCD or electroluminescent) have been known to be very useful for displaying information as the thin-film structures including the cross electrodes and contact pads, can be deposited on a glass substrate thereby providing a matrix display panel capable of being selectively energized to activate individual pixels thereon. One of the problems encountered in the manufacture of thin film display panels is the development of processes that pattern the thin film electrode structures while in an in-line deposition system.

Most thin-film devices have had their thin-film structures patterned either by a wet process known as photolithography or by shadow masking. Photolithography is very similar to processes used to develop photographs in that the deposit to be patterned is coated with light-sensitive material, which is then exposed to a negative or positive pattern and then developed and later stripped in various corrosive developing solutions. The disadvantages of this method is that it is slow and labor intensive, and involves many steps, each one subject to failure or possible contamination of the thin-film device.

With respect to the use of shadow masking to deposit thin-film structures, reference is made to U.S. Pat. No. 4,335,161 to Fang C. Luo, entitled "Thin-Film Transistors, Thin-Film Transistor Arrays and a Process for Preparing the Same". In summary, the Luo patent appears to disclose a method of preparing a thin-film transistor or an array of thin-film transistors by depositing in vacuum the different components through a single apertured mask, wherein the apertured mask is moved in predetermined pattern for the deposition of each of the components. In Luo, once the deposition of the different structures is complete, the assembly that is formed is then removed from the vacuum and the fabrication completed by techniques such as photolithography.

As in Luo, shadow masking is usually performed over small substrates with stiff masks that are manually clamped to ensure even contact with a particular substrate. This is a relatively slow process and usually requires breaking vacuum in the deposition chamber, resulting in some thin-film contamination. When depositing through a large area mask, it is common that the substrate is not perfectly flat or not level with respect to its surrounding substrate holder. The present invention addresses the problem arising from the difficulties of remote automatic handling of large area shadow masks in an in-line deposition system.

With respect to the use of photolithography, thin-film patterns have typically been aligned to the substrate and each other by optical means and the substrate is moved manually into position with the aid of a micromanipulator or an optical scanner which provides information to a computer which performs a similar function. The aligned substrate is then exposed and wet processed to achieve the desired pattern. In contrast, most shadow masking processes are aligned manually by dropping the masks over pins located on a substrate carrier. Therefore, an apparatus which is effective for remotely operating automatic masking systems where there is a need to eliminate the need for breaking vacuum, which would contaminate deposit of thin films, would be considered an advancement in the art.

DISCLOSURE OF THE INVENTION

It is therefore a primary object of this invention to enhance the art of thin-film structure deposition, and particularly the art involving thin-film display panels.

It is another object of this invention to provide an apparatus for aiding in the alignment of thin-film structures patterned in thin-film devices.

Still another object of the invention is to provide a method of aligning thin-film structures that are to be patterned on the substrate through the use of a vacuum deposition process.

A further object of the present invention is to provide an apparatus and a method for automatically aligning thin-film structures to be patterned on a substrate while in an in-line deposition system.

In acoordance with one aspect of this invention, there is provided an apparatus for the alignment of thin-film structure patterns on a substrate formed with the use of an apertured mask in a vacuum deposition system. The apparatus comprises a mask frame and a mask assembly affixed to the mask frame, the mask assembly including the apertured mask and mask alignment apertures which are disposed on either side of the mask. A mask holder frame is positioned adjacent the mask assembly and is affixed to the mask frame to form a mask holder assembly, the mask holder assembly having primary datum pins affixed thereto and protruding from the side of the holder assembly opposite said mask assembly. Finally, the alignment apparatus includes a substrate carrier, having a substrate supported therein, positioned adjacent and in operative contact with mask holder assembly; the substrate carrier has primary datum apertures, that engage with the primary pins of the mask holder assembly, which are disposed on the periphery of the carrier. In addition, the carrier has secondary datum pins protruding therefrom that engage with the mask alignment apertures of the mask assembly.

In accordance with another aspect of this invention, there is provided a method of aligning thin-film structure patterns on a substrate formed with the use of an apertured mask in a vacuum deposition system. The alignment method comprises the steps of positioning a mask holder assembly within a deposition chamber, such holder assembly having the apertured mask as part thereof and having means for engaging a substrate carrier. A substrate carrier is then positioned within the deposition chamber spaced from the mask holder assembly, the carrier having the substrate supported therein and having means for aligning the apertured mask with the substrate. The mask holder assembly is then engaged with the substrate carrier such that they are in operative contact. A magnet is then positioned in the deposition chamber adjacent the side of the substrate carrier opposite the mask holder assembly such that the apertured mask is held in operative contact With the substrate. Furthermore, a thin-film structure material is then vacuum-deposited through the apertured mask and the magnet is then removed from the substrate carrier and the mask holder assembly disengaged from the substrate carrier, thereby resulting in the formation of thin-film structures on the substrate.

In accordance with still another aspect of this invention, there is provided a method of aligning thin-film structure patterns on a substrate formed with the use of an apertured mask in a vacuum deposition system. The alignment method comprises the steps of providing a mask frame and affixing a mask assembly to the mask frame, the mask assembly including the apertured mask and mask alignment apertures that are disposed on either side of the mask. A mask holder frame is affixed through the mask assembly to the mask frame to form a mask holder assembly, the mask holder assembly having primary datum pins affixed therethrough and protruding from the side opposite the mask assembly. The mask holder assembly is then positioned in a vacuum deposition chamber while a substrate carrier is then positioned in the deposition chamber spaced from the mask holder assembly. The carrier has the substrate supported therein and has primary datum apertures disposed about the periphery of the carrier; the carrier has secondary datum pins protruding from the side adjacent the mask holder assembly. The mask holder assembly is then engaged with the substrate carrier such that the primary datum pins are first engaged with the primary apertures of the carrier while the secondary datum pins are subsequently engaged with the mask alignment apertures of the mask assembly. Next, a magnet is positioned in the deposition chamber adjacent the side of the carrier opposite the mask holder assembly such that the apertured mask is held in operative contact with the substrate; a thin-film structure material is then vacuum-deposited through the apertured mask. Finally the magnet is removed from the substrate carrier and the mask holder assembly is disengaged from the substrate carrier thereby resulting in the formation of thin-film structures on the substrate.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
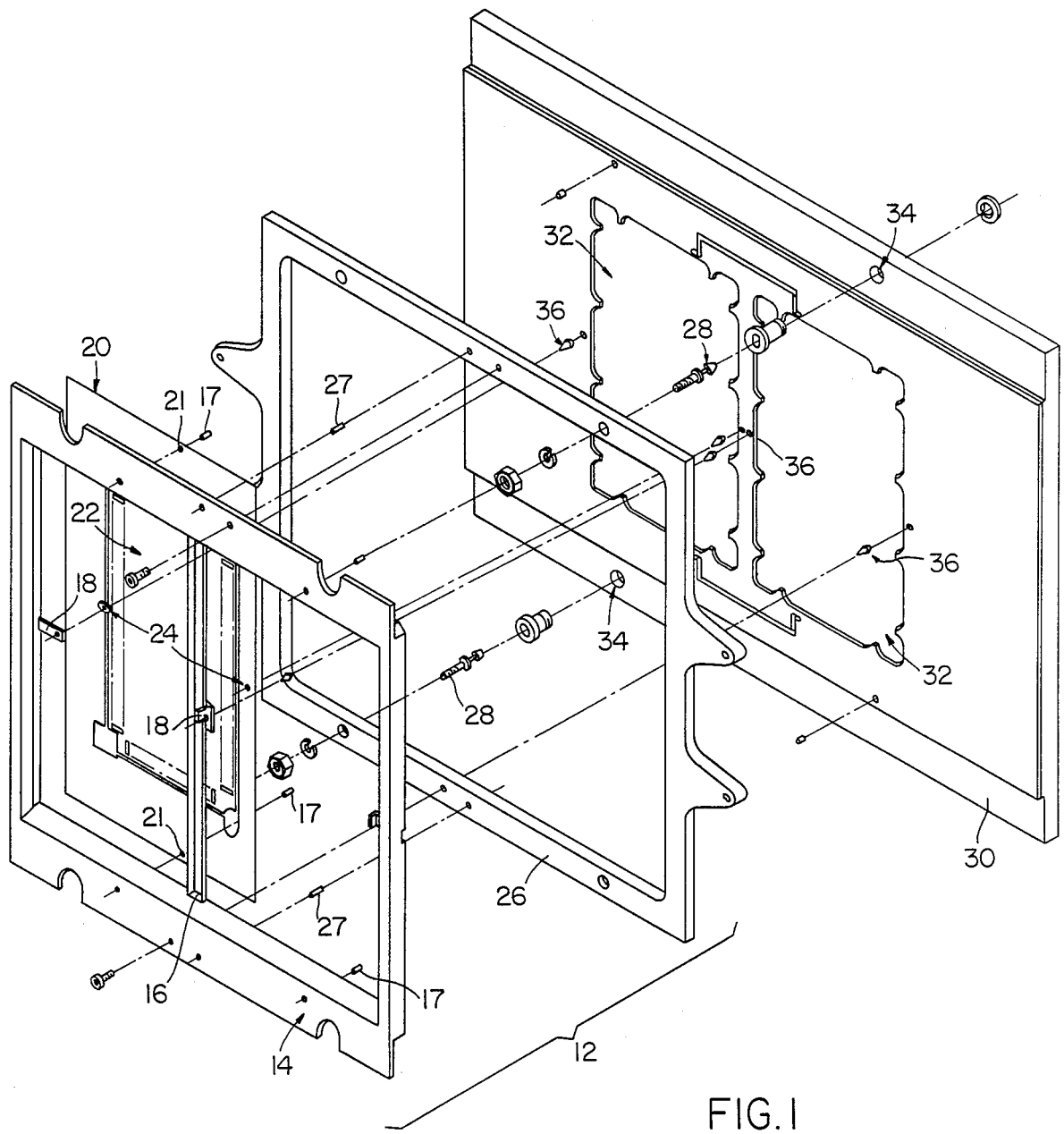
FIG. 1 illustrates an example of an embodiment of the apparatus for aligning an apertured mask against a substrate.

With particular attention to FIG. 1, there is illustrated a mask alignment or registration apparatus for ultimately aligning an apertured mask to a glass substrate on which thin-film structures are to be deposited. Alignment apparatus 10 is primarily comprised of a mask holder 12 and a substrate carrier 30, which supports (in this case) two substrates. In particular, mask holder assembly 12 is comprised of a mask frame 14, a mask assembly 20 and a mask holder frame 26. In this particular embodiment mask frame 14 is substantially rectangular in shape and has a frame center support 16, which supports one set of spring forks 18 that aid in engaging mask assembly 20 with substrate carrier 30, and has mask frame pins 17 (see FIG. 1). Mask holder frame 26 also has pins 27 located about its periphery (e.g. top and bottom) for allowing mask frame 14 to be affixed thereon.

Mask assembly 20 has mounting holes 21, for mounting mask assembly 20 to mask frame pins 17, and supports an apertured mask 22 which aids in depositing thin-film structures on a glass substrate. Mask assembly 20 also has mask alignment apertures 24 disposed on either side of apertured mask 22. In addition, mask holder frame 26 has primary datum pins 28 affixed thereto and protruding from the side opposite mask assembly 20. As will be described in detail later in the Specification, primary datum pins 28 serve to engage mask holder assembly 12 with substrate carrier 30.

Referring again to FIG. 1. In this particular embodiment substrate carrier 30 is illustrated having at least two substrates 32 supported therein. Substrate carrier 30 is also substantially rectangular in shape and has primary apertures 34 disposed about its periphery for engaging the primary datum pins 28 of mask holder assembly 12. Primary apertures 34 in this case are two in number and are typically named alignment or registration holes for the purpose of aligning mask holder assembly 12, containing mask assembly 20 with substrates 32 of substrate carrier 30. The present invention operates on the basis of a primary and secondary datum reference locations. The primary datum reference locatum is achieved when substrate carrier 30 is positioned adjacent and in operative contact with mask holder assembly 12 such that primary datum apertures 34 will engage with primary datum pins 28. Substrate carrier 30 also has a series of secondary datum pins 36 protruding therefrom that are disposed on the carrier side facing mask holder assembly 12. Secondary datum pins 36 will ultimately engage with secondary mask alignment apertures 24 of mask assembly 20. This engagement will nudge apertured mask 22 into the higher accuracy secondary datum reference location (i.e. pins 36 and apertures 24) in order to properly align apertured mask 22 with one of the substrates 32.

Spring forks 18 of mask frame 14 are considered means for aiding the engagement of mask assembly 20 with secondary datum pins 36 of substrate carrier 30. The spring forks are located substantially within and coplanar with mask frame 14. A spring fork (i.e. 18) is included for each of the secondary datum (i.e. 36) pins and are in operative contact with mask assembly 20 while being aligned with mask alignment apertures 24. In addition, apertured mask 22 is structurally relieved from mask assembly 20, which is rigidly attached within mask holder assembly 12, such that the mask is capable of being in operative contact with the substrate of substrate carrier 30. Mask alignment apertures 24 of mask assembly 20 include a hole and slot that engage with secondary pins 36 of substrate carrier 30, as illustrated in FIG. 1, and complete the secondary datum reference. As will be described in further detail in FIG. 2 and later in the Specification, alignment apparatus 10 further includes a magnet 56 disposed adjacent and in operative contact with substrate carrier 30. Magnet 56 is disposed on the side of carrier 30 opposite mask holder frame 26. Apertured mask 22, in this particular embodiment, can be designed for patterning electrode structures or electrode pad contacts, but is not limited to such structures.

The apparatus described in this invention is most effective for remotely operated automatic masking systems where there is a need to eliminate the breaking of vacuum which can contaminate the deposited thin-films. The invention provides a final secondary "short cut" datum registration or alignment system eliminating tolerance build-up caused by chained interregistration of many separate parts by leaping over these registrations and creating a new, independent datum. Without the final secondary "short cut" datum registration afforded by this invention, registration would be through a series of datum mask holder pins, carrier bushings, tooling and glass holders. Even with a 0.001 inch tolerance for each machined part, the total tolerance would be greater than 0.005 inch and unacceptable towards making the patterns register for electrical connection off of a glass display substrate. Furthermore, the method for providing the final registration must be compatible with mechanical shadow masking to prevent blurs and defects in the resulting patterns.

We have discovered that our present mask design allows enough forced movement of apertured mask 22 about its primary datum reference location through a crude series of chained datums, that a secondary independent datum can be used to make a more precise final registration of apertured mask 22. The secondary independent datum, in this case secondary datum pins 36 and mask alignment aperatures 24, brings the pattern registration within the difficult tolerance needed to make a thin-film structure for a thin-film device. In FIG. 1 the location of the large primary chained datum registration pins 28 register mask assembly 12 to substrate carrier 30. The location of the much smaller secondary datum pins help register apertured mask 22 to substrate 32 with high precision. This invention requires the less accurate chained registration system (i.e., primary datum pins 28 and primary apertures 34) to get tolerances within a certain range to allow the secondary datum system of the invention to engage and take effect.

A typical operation of the alignment, apparatus' primary and secondary datum reference system consists of ultimately locating mask assembly 20 over secondary datum pins 36, by first engaging mask holder assembly 12 with the less accurate, chained primary datum of mask frame 14 and substrate carrier 30. As mask holder assembly 12 reaches the end of its primary engagement stroke, mask assembly 20 begins to push mask alignment apertures 24 over the shorter length secondary datum pins 36. This engagement nudges the apertured mask 22 into the higher accuracy secondary datum reference location. Spring forks 18, mounted on and about mask frame 14, aid in the engagement of alignment apertures 24 with secondary pins 36. The spring forks press on mask assembly 20 only at the secondary pin locations so that friction does not inhibit lateral movement of mask assembly 20 which would prevent it from aligning with the pin position. Also, pressing at only the pin locations reduces mask stress, which can blur the mask pattern during the subsequent deposition step. After mask assembly 20 is neatly engaged on secondary pins 36, a hold-down system such as magnet 56 brings mask 22 tight against glass substrate 32. Secondary registration or alignment is best performed by using specially shaped apertures 24: a hole on one side of mask 22 and a slot on the other side so that secondary pins 36, utilizing these holes, do not bind with each other. Binding of the secondary datums with the primary datums does not occur because the alignment error between the separate datums is less than the flexible movement of mask 22.

Figure 2:
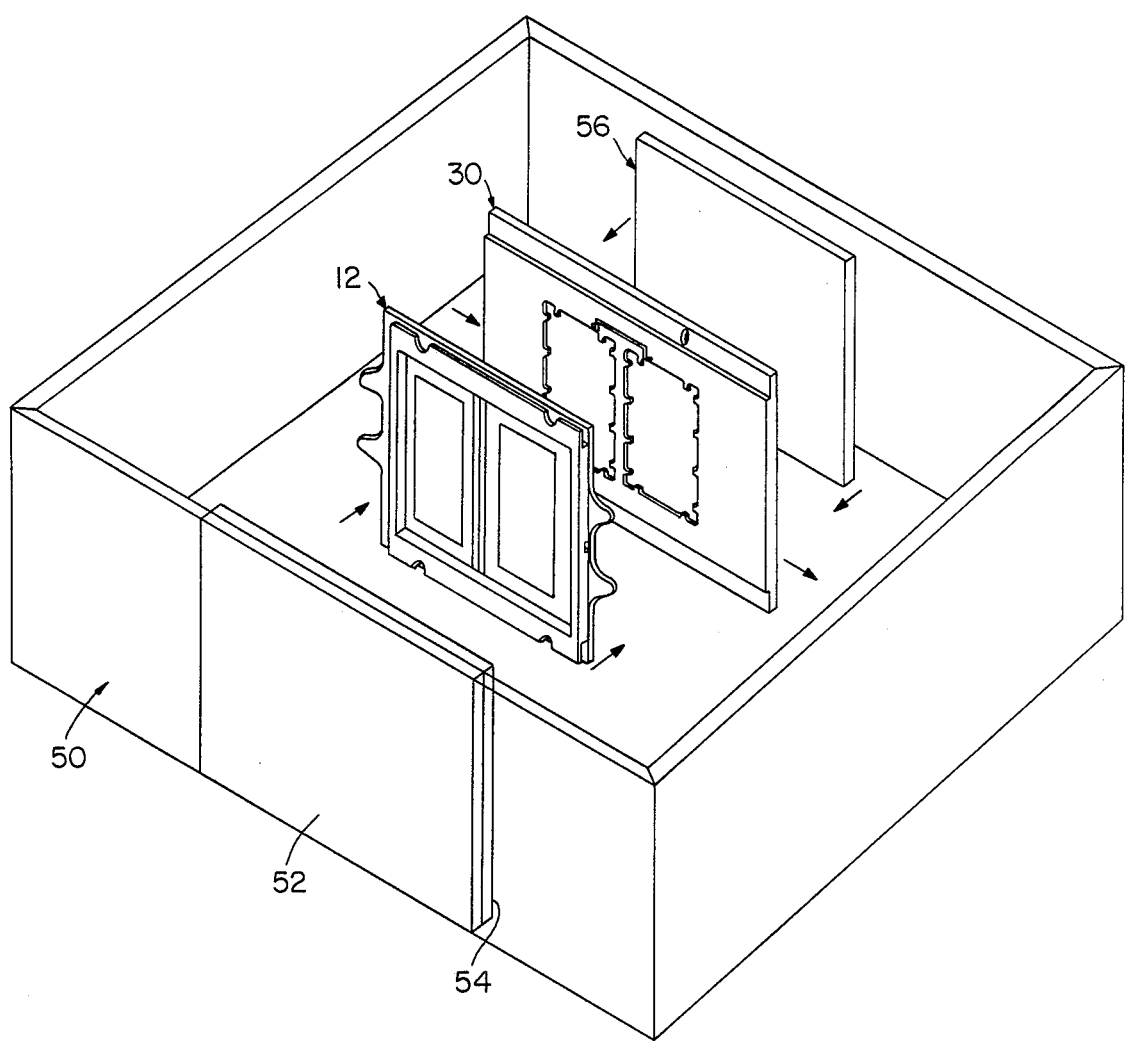
FIG. 2 illustrates an example of the alignment apparatus of FIG. 1 within a deposition chamber that aids in describing the automatic aligning procedure.

Referring now to FIG. 2, there is illustrated alignment apparatus 10 inside a vacuum deposition chamber 50 along with magnet 56 and sputtering apparatus 52. FIG. 2 illustrates a portion of a deposition system which may either be from an in-line or from a batch process type system. Sputtering apparatus 52 also has a layer of deposition material 54 thereon which will be deposited through apertured mask 22 onto one of the substrates of substrate carrier 30.

The following will be a description of the method of aligning thin-film structure patterns on a substrate formed with the use of an apertured mask in a vacuum deposition system. With the aid of FIG. 2, the method comprises the steps of positioning a mask holder assembly 12 within a deposition chamber 50, mask holder assembly 12 having apertured mask 22 as part thereof and having means for engaging substrate carrier 30. A substrate carrier 30 is then positioned within deposition chamber 50 spaced from mask holder assembly 12, carrier 30 having a substrate supported therein and having means for aligning apertured mask 22 with the substrate. Next, mask holder assembly 12 is engaged with substrate carrier 30 such that they are in operative contact. A magnet 56 is then positioned in the deposition chamber adjacent the side of substrate carrier 30 opposite mask holder assembly 12 such that apertured mask 22 is held in operative contact with the substrate. Thin-film structure material 54 is then vacuum-deposited through apertured mask 22. Finally, magnet 56 is removed from substrate carrier 30 and mask holder assembly 12 is disengaged from carrier 30, thereby resulting in the formation oi thin-film structures on the substrate.

As described earlier, mask holder assembly 12 is comprised of mask frame 14, mask assembly affixed to mask frame 14 and a mask holder frame 26 that is affixed through mask assembly 20 to mask frame 14. In the method described, means for engaging substrate carrier 30 includes primary datum pins 28 affixed through and protruding from mask holder assembly 12 on the side opposite mask assembly 20. Substrate carrier 30 has primary apertures 34 disposed about the periphery for engaging primary datum pins 28. All of the steps of the method described in aligning the thin-film structure patterns on the substrate can be performed automatically in an in-line deposition system. The step of vacuum-depositing includes sputtering, vapor deposition, or chemical vapor deposition.

This invention can be varied in a number of ways, but the basic operation of prealignment with a primary datum, (i.e. pins 28 and apertures 34) realignment with a more precise secondary datum (i.e. pins 36 and apertures 24), and engagement of the mask assembly with a hold-down spring, remains the same. One can, for example put bushings on the mask assembly which might engage with pins on the carrier, or one might put bushings on the carrier which engage with pins on the mask assembly, or one might change the shape or location of the hold-down spring which activates the secondary alignment prior to engaging the magnet.

Additional advantages of this type of registration or alignment system is that it is self-aligning and requires no expensive electro-optical sensing to align the patterns. In operation, it provides operators with a direct view of the alignment correction by the amount that the mask appears shifted from having the pins in the center of the secondary datums before engagement. This gives an early indication of problems which might be occurring with the primary datums. Finally, precise alignment by the system is extremely fast, occurring in less than half a second, where other such methods require usually much longer than five seconds for operation.

While there have been shown and described what are at present considered the preferred embodiments of the present invention, it will obvious to one skilled in the art that various changes and modifications may be made therein without departing from the scope of the invention as defined by the appended claims.

What is claimed is:

1. Method of aligning thin-film structure patterns on a substrate formed with the use of an apertured mask in a vacum deposition system, said method comprising the steps of:

positioning a mask holder assembly within a deposition chamber, said mask holder assembly having primary datum pins protruding therefrom and including said apertured mask as part thereof, said mask having secondary mask alignment apertures disposed on each side of said apertured mask;

positioning a substrate carrier within said deposition chamber spaced from said mask holder assembly, said carrier having said substrate supported therein, said substrate carrier having primary datum apertures for engaging said primary datum pins and having secondary datum pins protruding therefrom for engaging with said secondary mask alignment apertures;

engaging said mask holder assembly with said substrate carrier within said deposition chamber such that they are in operative contact, such that said primary datum pins are engaged with said primary datum apertures and said secondary datum pins are engaged with said secondary mask alignment apertures;

positioning a magnet in said deposition chamber adjacent the side of said substrate carrier opposed said mask holder assembly such that said apertured mask is held in operative contact with said substrate;

vacuum-depositing a thin-film structure material through said apertured mask; and removing said magnet from said substrate carrier and disengaging said mask holder assembly from said substrate carrier, thereby resulting in the formation of said thin-film structures on said substrate.

2. The method according to claim 1 wherein said apertured mask is structurally relieved from said mask assembly, which is rigidly attached within said mask holder assembly, such that said mask is capable of operatively contacting said substrate when said magnet is disposed on the side of said substrate carrier opposed said mask.

3. The method according to claim 1 wherein all of said steps of said method of aligning said thin-film structure patterns are performed automatically in an in-line deposition system.

4. The method according to claim 1 wherein said step of vacuum depositing includes sputtering or vapor deposition.

5. The method according to claim 4 wherein said step of vacum depositing is by chemical vapor deposition.

6. Method of aligning thin-film structures patterns on a substrate formed with the use of an apertured mask in a vacuum deposition system, said method comprising the steps of:

providing a mask frame;

affixing a mask assembly to said mask frame, said mask assembly having said apertured mask and mask alignment apertures that are disposed on either side of said apertured mask;

affixing a mask holder frame through such mask assembly to mask frame to form a mask holder assembly. said mask holder assembly having primary datum pins affixed therethrough and protruding from the side opposite said mask assembly;

positioning said mask holder assembly in a vacuum deposition chamber;

positoning a substrate carrier in said deposition chamber spaced from said mask holder assembly, said substrate carrier having said substrate supported therein and having primary apertures disposed about the periphery of said carrier, said carrier having secondary datum pins protruding from the side adjacent said mask holder assembly;

engaging said mask holder assembly with said substrate carrier within said deposition chamber such that said primary datum pins are first engaged with said primary datum apertures of said carrier while said secondary datum pins are subsequently engaged with said mask alignment apertures of said mask assembly;

positioning a magnet in said deposition chamber adjacent the side of said substrate carrier opposite said mask holder assembly such that said apertured mask is held in operative contact with said substrate;

vacuum depositing a thin-film structure material through said apertured mask; and removing said magnet from said substrate carrier and disengaging said mask holder assembly from said substrate carrier, thereby resulting in the formation of said thin-film structures on said substrate.

* * * * *